United States Patent [19]

Blaum et al.

[11] Patent Number: 5,461,631

[45] Date of Patent: Oct. 24, 1995

[54] METHOD FOR BIT RESYNCHRONIZATION OF CODE-CONSTRAINED SEQUENCES

[75] Inventors: Miguel M. Blaum, San Jose; Jehoshua Bruck, Palo Alto; Constantin M. Melas, Los Gatos, all of Calif.

[73] Assignee: International Business Machines Corporation, Armonk, N.Y.

[21] Appl. No.: 990,911

[22] Filed: Dec. 15, 1992

[51] Int. Cl.$^6$ .................................................. G06F 11/00
[52] U.S. Cl. ................. 395/182.04; 371/42; 395/183.11
[58] Field of Search ................ 371/39.1, 40.1–40.4, 371/42, 47, 2.1, 35

[56] References Cited

U.S. PATENT DOCUMENTS

| | | | |
|---|---|---|---|
| 3,689,899 | 9/1972 | Franaszek | 340/172.5 |
| 3,873,920 | 3/1975 | Apple, Jr. et al. | 325/41 |
| 4,042,783 | 8/1977 | Gindi | 172/15 |
| 4,357,702 | 11/1982 | Chase et al. | 371/1 |
| 4,377,863 | 3/1983 | Legory et al. | 371/42 |
| 4,413,251 | 11/1983 | Adler et al. | 340/347 |
| 4,635,262 | 1/1987 | Kittel | 371/42 |
| 4,726,029 | 2/1988 | Motley et al. | 371/35 |
| 4,779,275 | 10/1988 | Yoshimoto | 371/42 |
| 4,922,494 | 5/1990 | Pirani et al. | 371/35 |
| 5,038,351 | 8/1991 | Sakai et al. | 371/47 |
| 5,109,385 | 4/1992 | Karp et al. | 371/42 |
| 5,220,568 | 6/1993 | Howe et al. | 371/42 |
| 5,271,016 | 12/1993 | Hilden et al. | 371/42 |

OTHER PUBLICATIONS

P. H. Siegel, Recording Codes for Digital Magnetic Storage, IEEE Transactions on Magnetics, vol. MAG–21, No. 5, Sep. 1985.

T. D. Howell, Statistical Properties of Selected Recording Codes, IBM Research Report, 5814 (58544) Aug. 26, 1987.

*Primary Examiner*—Roy N. Envall, Jr.
*Assistant Examiner*—Thomas E. Brown
*Attorney, Agent, or Firm*—Philip E. Blair; James C. Pintner

[57] ABSTRACT

A method is disclosed for recovery from synchronization errors caused by deletions and/or insertions of symbols in the presence of errors that alter the symbols in any code constrained binary record. The method initially divides the sequence of data into equal size blocks before appending a binary sync sequence at the end of each block not encountered in the block. Then, the blocks are resynchronized by first determining the size of any symbol insertions and/or deletions that have occurred. Then, scanning for the sync sequence starting at the presumed end of the data field of the current block so as to determine the offset of the sync sequence with respect to that specific location. After this location of the insertions and/or deletions has been determined, a corresponding number of symbols can be added or deleted from the middle of the block according to the offset determined by the present method.

18 Claims, No Drawings

METHOD FOR BIT RESYNCHRONIZATION OF CODE-CONSTRAINED SEQUENCES

FIELD OF THE INVENTION

Broadly conceived, the present invention relates to methods for bit error detection and correction in digital communication, and in particular, to methods for recovering from bit synchronization errors caused by insertions and deletions in code-constrained sequences in the presence of random errors.

BACKGROUND HISTORY

Digital systems transmit a stream of information which is represented by string of bits of 1's and 0's. A group of bits forms a byte and groups of bytes form records. As one digital system communicates with another system, a sequence of records are sent over some form of communication link or channel. The channel may be a disk read-head, or the wires between two telephones, or even the air waves over which satellites communicate with ground based antenna dishes linked to signal receiving equipment.

One way in the art for increasing the reliability of data transmitted through communication channels is by using code constrained sequences. An example of code is the run-length-limited code, used exclusively in magnetic or optical recording, wherein each 1 in a coded bit sequence is separated from an adjacent 1 by a stream of 0's at least equal to a minimum quantity d but not exceeding a maximum number k. Two of the most common (d,k) codes to constrain such sequences are the (1,7) and (2,7) codes.

Another example of code commonly used sod in communications is the parity check, in which a bit is added to a byte to make the sum of all ones in the byte odd. Any error making the sum of all ones even is detected by this code.

A single error occurs when a binary symbol is changed to another binary symbol, i.e., either a 0 gets transformed into a 1 (denoted 0⇒1) or a 1 becomes a 0 (denoted 1⇒0). Double adjacent errors occur in a (d,k) code when a (0 1) ⇒(1 0) or (1 0 ⇒(0 1). An error affecting more than two bits in the sequence but remaining localized is defined as a burst error. All the above errors involve the modification of binary symbols. Bit synchronization errors occur when binary symbols are inserted or deleted.

Synchronization is a method wherein known sequences of 1's and 0's, or codewords, are injected into the bit stream at regular intervals. The receiver checks for the position of these markers. If the marker is at its expected position within the stream then the data bits transmitted up to that point are at least synchronous. In other words, the number of bits transmitted between markers equals the number of bits received between markers. A loss of synchronization is determined by a change in the location of the markers. If the sync marker is not at its location then symbol deletions or additions have occurred between the markers. This occurrence is known as a bit synchronization loss.

The following example illustrates the catastrophic nature of a loss of bit synchronization.

Assume that the following information string A of length 100 bits has been transmitted.

```
A = 1 1 1 1 0 0 1 1 1 0 1 0 0 0 1 0 0 1 1 1 1 1 0 0 1
    0 1 0 1 1 1 1 0 0 1 1 0 1 1 1 1 1 0 0 0 1 1 1 1 0 0
    0 0 1 1 0 0 1 1 0 1 1 1 0 0 0 0 0 1 1 1 1 0 1 1 1
    0 0 1 1 0 1 1 0 1 0 0 0 0 0 0 1 0 1 0 1 0 1 1 1 1
```

Encoding string A into a (1,7)-constrained sequence of length 150 produces string B. Notice that in the (1,7) code used to generate string B, at most a single 1 will be followed by at most 7 consecutive 0's.

```
B = 0 1 0 1 0 0 0 0 0 0 1 0 1 0 1 0 0 0 1 0 0 0 1 0 1 0 0 0 1 0
    0 0 0 1 0 1 0 1(0)1 0 0 1 0 0 1 0 0 0 0 0 0 1 0 1 0 1 0 1 0
    0 0 0 1 0 0 0 1 0 1 0 0 0 0 0 0 1 0 0 1 0 1 0 1 0 1 0 1 0 1
    0 1 0 0 0 0 0 1 0 0 1 0 0 1 0 0 0 0 1 0 0 1 0 1 0 0 0 0 0 1
    0 0 0 1 0 1 0 0 1 0 1 0 0 1 0 0 1 0 1 0 0 1 0 0 1 0 0 1 0 0
```

Now, assume that string C was received.

```
C = 0 1 0 1 0 0 0 0 0 0 1 0 1 0 1 0 0 0 1 0 0 0 1 0 1 0 0 0 1 0
    0 0 0 1 0 1 0 1*1 0 0 1 0 0 1 0 0 0 0 0 0 1 0 1 0 1 0 1 0 0
    0 0 1 0 0 0 1 0 1 0 0 0 0 0 0 1 0 0 1 0 1 0 1 0 1 0 1 0 1 0
    1 0 0 0 0 0 1 0 0 1 0 0 1 0 0 0 0 1 0 0 1 0 1 0 0 0 0 0 1 0
    0 0 1 0 1 0 0 1 0 1 0 0 1 0 0 1 0 1 0 0 1 0 0 1 0 0 1 0 0
```

Observe that at bit 39 of string B (indicated by parenthesis), a single 0 has been deleted thereby causing a loss of synchronization wherein all subsequent bits shift one bit to the left. The '*' in string C indicates where the deletion occurred on the received string.

If the result of decoding string C is EXCLUSIVE-OR'd with the original string A to determine the degree of the error introduced, the following error string R is obtained. Note that a 0 denotes no error for that particular bit in the original transmitted sequence.

```
R = 0 0 0 0 0 0 0 0 0 0 0 0 0 0 0 0 0 0 0 0 0 0 0(1)1
    1 1 1 0 0 0 0 1 1 1 1 1 1 1 0 0 0 1 1 0 0 0 0 1 0
    1 1 1 1 1 1 1 1 0 0 0 1 0 1 0 1 1 1 0 1 1 1 0 0
    1 0 1 1 1 1 1 0 1 1 0 1 0 1 1 1 1 1 1 1 0 0 0 0
```

Observe that starting at bit 24, (indicated by parenthesis), a continuous string of errors has resulted from the single deletion of one bit. In this example, the receiver would be out of synchronization with the transmitter from bit 39 onward and, absent any re-synchronization detection and recovery, the data would be lost.

Although deletions and insertions are not as common as other kinds of errors, it is important to this art to be able to detect synchronization errors and distinguish them from random and peak shift errors because if the correct number of insertions or deletions that occurred can be correctly determined in a transmitted interval of data the overall damage to the information stream may be repairable or at least minimized by the subsequent restoration of synchronization. It is even more important to this art to be able to recover from these errors, specifically in the widely used code-constrained sequences.

Summary and Objects of the Invention

The present invention relates to methods for recovering from synchronization errors in code-constrained sequences when other errors are present.

It is a primary object of the present invention to provide a method for detecting and recovering from synchronization errors which allows for the identification of a certain number of insertions and deletions of a symbol in any code constrained binary sequence of data.

Briefly and to achieve the foregoing objects in accordance with the present invention as embodied and broadly described herein, a method is provided for recovery from synchronization errors caused by deletions and/or insertions of symbols in the presence of errors that alter the symbols in any code constrained binary sequence. The present method has the first step of dividing the data sequence into equal size blocks before appending a binary synchronization vector at the end of each block. Then, detecting and resynchronizing the blocks by initially determining the size of any symbol insertions and/or deletions. The resynchronization detection and recovery has the steps of first scanning for the inserted synchronization vector starting at the presumed end of the current datablock then determining the offset of the inserted synchronization vector before inserting or deleting a predetermined number of symbols in the block according to the offset in order to recover from loss of synchronization.

It is an advantage of the present method to minimize the error correction work of the ECC such that a higher density of stored data can be achieved.

Additional objects and advantages of the present invention will be set forth in the description which follows, and in part will be obvious from the description or may be learned by the practice of this invention. The objects and advantages of this invention as described herein may be realized and obtained by means particularly pointed out and distinctly claimed in the appended claims taken in conjunction with the detailed specification.

Detailed Description of the Preferred Embodiment

The present method is directed to detection and recovery from loss of synchronization caused by deletions and/or insertions of symbols in a code-constrained sequence.

A stream of uncoded digital data is code constrained then stored to, for example, a disk drive. The encoded sequence of data is composed of a sequence of N-bit bytes, including the added ECC bytes. Before removal of the encoded data, synchronization must be checked.

A resynchronization vector can be detected in the encoded sequence. For instance, if the synchronization vector is recognized 5 bits past the position it is suppose to be located at then a single 5 bit insertion error has occurred. In other words, a total of 5 bits have been inserted into the datablock. Conversely, if the synchronization vector was found to occur 3 bits before the presumed end of the block then the loss of synchronization is due to deletions. Generally, if the synchronization vector is located within a predetermined range near the end of each block then, if the position of that vector has changed, the assumption is that synchronization errors have occurred. Without a method for detection and recovery from loss of synchronization, the data subsequent to that point will be lost.

The preferred embodiment of the present method has the first step of dividing the data into blocks of predetermined length according to the statistics of known errors of the channel through which the data stream travels. A synchronization vector must then be selected to be positioned at the end of each block. The synchronization vector preferably should be a sequence of specific symbols not encountered in the data. For instance, in a (1,7)-constrained sequence, any single 1 bit will be followed by at most 7 consecutive zeros. This means that there will never be 8 consecutive zeros unless this sequence is at the end of a datablock which indicates that it is a synchronization vector. (Also, 8 consecutive zeros may be caused by errors.)

Suppose the data sequence has been (1,7)-constrained. The preferred selected synchronization vector of length 14 bits would have a run of 8 consecutive zeros, as defined below, wherein x is the complement of the previous bit and y is the complement of the next bit. This vector is given as:

$$\vec{r}_1 = x010000000010y$$

There are other possible patterns for the synchronization vector $\vec{r}$ depending on the code-constraints of the data. For instance, one could use 7 consecutive zeros instead of 8. This vector is given as:

$$\vec{r}_2 = x01000000010y$$

Other configurations within the scope of the preferred embodiment involve eliminating the bits x and y from vector $\vec{r}_1$ to obtain:

$$\vec{r}_3 = 010000000010$$

Similarly, from synchronization vector $\vec{r}_2$ obtain:

$$\vec{r}_4 = 01000000010$$

For any (d,k)-constraint, a generalized synchronization vector $\vec{r}$ of length (k+2d+5) can be defined. This generalized vector is given as:

$$r = x \overset{|\ \ d\ \ |}{00\ldots0} 1 \overset{|k+1|}{00\ldots0} 1 \overset{|\ d\ |}{00\ldots0} y$$

Once the synchronization vector has been selected, it must be encoded in the data stream. To illustrate this step of the preferred embodiment, assume a random sequence of length 64 (8 bytes) which is in the presence of random errors. For example, such a random data stream sequence can be given as:

A=0000110010111000111110101101110100100111011100001-000101010110001

Next, encode string A into a (1,7)-constrained sequence B. Divide the code-constrained sequence B into blocks of length 16 as follows:

B = 0100100101010101
    0010100001010000
    0100100101010000
    0010101000100000
    1000001001010001
    0100100100101010

For illustration of the preferred embodiment, the configuration of the synchronization vector $\vec{r}_1$ is used. Thus, concatenating vector $\vec{r}_1$ to the end of each block of length 16 in string B, the following is obtained:

```
C = 0100100101010101 00100000000101
    0010100001010000 10100000000101
    0100100101010000 10100000000101
    0010101000100000 10100000000100
    1000001001010001 00100000000101
    0100100100101010 10100000000101
```

Thus, each block therein is now composed of 30 bits, wherein the first 16 bits correspond to the original (1,7) code-constrained sequence and the last 14 bits correspond to the previously defined synchronization vector $\vec{r}_1$. Since there is a unique run of 8 consecutive zeros in the synchronization vector $\vec{r}_1$, in the absence of errors at the end of each block of string C, the location of this unique sequence is clearly identifiable. As such, if a limited number of insertions and deletions has occurred between blocks then, by determining the offset to the right or to the left the pattern with 8 consecutive zeros has consequently shifted, the difference between the number of deletions and the number of insertions in a specific block can be determined.

The second phase of the method of the preferred embodiment involves detecting and resynchronizing the code-constrained sequence. This involves the steps of first looking for a run of (k+1) consecutive 0's starting in location (m−k−d−2) of the current block, where d and k are the parameters of the code-constraints and m is the length of the sequence. Then, determining the offset of the run of (k+1) consecutive 0's with respect to location (m−k−d−2) in the block before recovering from the loss of synchronization by adding or subtracting a number of symbols in the middle of the block according to the offset described above.

In order to facilitate the implementation and understanding of the method of the preferred embodiment of the present invention, pseudocode is provided for detection and recovery from loss of synchronization. It should be understood that the following pseudocode can be implemented in a variety of different computer languages on differing computer systems. Therefore, the following code is not meant to be limiting but rather to be representative of the present method described and claimed herein.

To illustrate, consider a (1,7) code-constrained sequence given as:

ti $\vec{u}$=0010001010000000100010010001

This code-constrained vector $\vec{u}$ can be represented as individual vectors given as: $\vec{u}=\vec{u}_1, \vec{u}_2, \vec{u}_3, \vec{u}_4, \vec{u}_5, \vec{u}_6, \vec{u}_7$, where the individual vectors are defined as: $\vec{u}_1$=001, $\vec{u}_2$=0001, $\vec{u}_3$=01, $\vec{u}_4$=00000001, $\vec{u}_5$=0001, $\vec{u}_6$=001, and $\vec{u}_7$=00001. Notice that the lengths of the individual vectors are: $u_1$=3, $u_2$=4, $u_3$=2, $u_4$=8, $u_5$=4, $u_6$=3, and $u_7$=5.

Initially, let the code-constrained sequence be a sequence of individual vectors $\vec{u}_1, \vec{u}_2, \ldots, \vec{u}_i$, where each vector $\vec{u}_i$ is a run of zeros followed by a 1 and $u_i$ is the length of that vector's run. In addition, S is a marker for the current location in the entire string, i is the index of the next code-constrained sequence in the block, m is the length of a block, and Offset is an offset used in part to indicate the position in the code-constrained sequence where the insertions and/or deletions have occurred. Again, note that an input vector's length is defined herein as a string of one or more 0's followed by and including a 1 bit. For example, the vector 00001 has a length of 5. Similarly, the vector 01 has a length of 2 and the vector 1 has a length of 1. The pseudocode is as follows:

```
1:  S ← 0, i ← 1
2:  LOOP: Input u⃗ᵢ
3:      IF uᵢ ≠ 9 THEN
4:          S ← (S + uᵢ), i ← (i + 1), Go To LOOP
5:      ELSE
6:          Offset ← (−S−11 mod m).
7:          IF Offset = 0 or |offset| > 6 THEN
8:              S ← (S + uᵢ), i ← (i + 1), Go To LOOP
9:          ELSE
10:             IF Offset > THEN
11:                 Insert Offset symbols in u⃗ᵢ at (S−FLOOR((m−14)/2)
12:                 S ← (S + uᵢ + Offset), i ← (i + 1), Go To LOOP
13:             ELSE
14:                 Delete Offset symbols in u⃗ at (S−FLOOR((m−14)/2)
15:                 S ← (S + uᵢ + Offset), i ← (i + 1), Go To LOOP
```

In Line 1 of the above pseudocode, the location marker S is assigned the value 0 and i is assigned the initial value of 1 to point to the first input length in the code-constrained sequence. The LOOP of Line 2 is continuously repeatable for all input vectors $\vec{u}_i$. If, in Line 3, the input length $u_i$ is not equal to 9, which is the length of the run of 8 consecutive zeros plus the trailing 1 bit of the synchronization vector, then, in Line 4, the location marker S is incremented by the input length and the index i gets incremented by 1 for the next iteration of the loop. Control is passed to Line 2 for the next input vector in the code-constrained sequence. If, in Line 3, the input length $u_i$ is identically equal to 9 then, in Line 6, Offset gets assigned the value of (−S−11 mod m) in preparation for a subsequent determination if insertions or deletions have occurred.

In Line 7, if Offset is identically equal to zero or the absolute value of Offset is strictly greater than 6, this means that either no insertions or deletions have occurred, too many have occurred or got a false run of 8 zeros due to errors. As a result, the location marker S gets incremented by length $u_i$. Control passes to Line 2 for input of the next vector in the code-constrained sequence.

However, if the condition of Line 7 evaluates to false then at this point Offset contains the number of either insertions or deletions that have occurred. A determination must then be made as to whether either Offset number of insertions has occurred or Offset number of deletions has occurred. If the value of Offset is strictly greater than zero, in Line 10, a total of Offset number of symbols have been deleted from the vector. To correct for loss of synchronization due to Offset number of deletions occurring, a total of Offset symbols (either 1's or 0's) are then inserted into the vector $\vec{u}$ starting at location (S minus the floor of (m−14)/2). It should be appreciated that the floor is a mathematical operation wherein the smallest integer value is returned, for instance, the floor of 13/5 is 2 and not 3. In Line 12, the location marker S gets incremented by length plus the value of Offset. This positions location marker S to the start in the next vector $\vec{u}$ corresponding to the next input length $u_i$. The index i gets incremented for the next iteration. Control passes to Line 2 for the next input.

Otherwise, if the condition of Line 10 does not evaluate to true then, in Line 14, a total number of Offset insertions have occurred. As a result of this determination and to correct for the loss of synchronization due to the addition of one or more symbols, a total of Offset symbols are deleted from the vector $\vec{u}$ starting at location S minus the floor of ((m−14)/2). In line 15, the location marker S is incremented by length $u_i$ plus the value of Offset. This repositions location marker S to the beginning of the next sequence corresponding to the next input length $u_i$. The index i is incremented for the next iteration. Control is returned to the beginning of the loop for the next input.

The above-described algorithm, if no insertions or deletions have occurred in the current block under scrutiny and the run of 8 consecutive zeros corresponding to the synchronization vector $\vec{r}$ is error free then this run of 8 consecutive zeros must start at location (−10 mod m). However, if a given number of $l_d$ deletions have occurred, where $l_d \leq 6$, the run of 8 consecutive zeros in this block must start at location $((-10-l_d) \mod m)$. Similarly, if a given number of $l_d$ insertions have occurred, the run of 8 consecutive zeros in this block must start at location $((-10+l_d) \mod m)$. If $l_d$ is zero then no deletions nor insertions have occurred. The search continues for the next run of 8 consecutive zeros plus the trailing 1 bit. If $l_d$ is not zero but its absolute value is greater than 6, the present method ignores the event and continues forward because this event may have been caused by random errors without insertions or deletions being involved. However, if $1 \leq l_d \leq 6$, it is likely that la deletions have occurred. A process for recovery of loss of synchronization is then required. Since it is not known where the deletions have occurred thus, $l_d$ symbols in the middle of the current block are inserted, i.e., at location $(m-14)/2$. Similarly, if $-1 \leq l_d \leq -6$ then $l_d$ insertions have most likely occurred. In this case, $l_d$ symbols are deleted from the middle of the block.

The following example serves to illustrate the implementation and use of the above algorithm. It should also be understood that this example is for illustration purposes and is not to be considered as limiting to the scope of the present method. This example is specifically directed to a (d,k)-constrained sequence although it should be understood that the method of the present invention is equally applicable to other code-constrained sequences which are not (d,k)-constrained.

For illustrative purposes in order to show the operation of the above algorithm, assume a random input sequence of bits of data of length 60 in the presence of random errors which is ECC encoded. String A is given as follows:

A=000011001011100011111010110111010010011101110000100010101011

String A is now encoded into a (1,7) code-constrained sequence. The following code-constrained string B is obtained from string A and has a length of 90 bits. Note that each 1 bit in the code-constrained sequence is now separated from an adjacent 1 bit by a stream of consecutive 0's at least equal to a minimum quantity of 1 but not exceeding a maximum quantity of 7.

In accordance with the first step of the present method, code-constrained string B is divided into blocks. The length of each block of string B is m=30 as follows:

B = 010010010101010100101000010100
    000100100101010000001010100010
    000010000010010100010100100100

Once string B has been code-constrained, a synchronization vector must be selected and added to the end of each block of string B. For purposes of the present example, synchronization vector $\vec{r}_1$ of length 14 with 8 consecutive zeros as previously defined is selected and subsequently added to the end of each block. The result is string C which is given as follows:

C = 010010010101010100101000010100 10100000000101
    000100100101010000001010100010 10100000000101
    000010000010010100010100100100 10100000000101

It should be appreciated that the length of each block of string C is now m=(30+14)=44. Now, assume that the following string D was received and is to be checked by using the above-described algorithm to determine and subsequently correct any loss of synchronization. String D is given as follows:

D = 010010010101010100101000011001 01000000001010
    000100100101010000001010100010 10100000000101
    000010000010010100010100100100 10100000000101

For comparison purposes, the individual blocks of the received string D are shown juxtaposed to the blocks of the transmitted string C so that the synchronization loss can be clearly shown.

$C_1$ = 010010010101010100101000010100 10100000000101
$D_1$ = 010010010101010100101000011001 01000000001010
$C_2$ = 000100100101010000001010100010 10100000000101
$D_2$ = 001001001010100000010101000101 01000000001010
$C_3$ = 000010000010010100010100100100 10100000000101
$D_3$ = 000100000100101000101001001001 0100000000101

In this example, there is a loss of synchronization between the transmitted block $C_1$ and the received block $D_1$ with a resulting shift between transmitted blocks $C_2$ and $C_3$ and the received blocks $D_2$ and $D_3$.

In order to obtain the lengths of each vector $\vec{u}_i$, string D is divided in such a manner wherein the different lengths of the individual vectors that make up string D are represented by numerals.

$C_n$=23322223252329243322722422925632423333292

$D_n$=23322223251329243322722422929463242333292

To apply the present algorithm, in Line 1, the location marker S and the index i are initialized to 0 and 1 respectively. At the top of the loop in Line 2, the length of the first input vector $\vec{u}_1$ is checked. This vector has the form 01 and is of length 2. The value of its length is not equal to 9, in Line 3. Therefore, location S gets incremented to $(S+\vec{u}_i)=(0+2)=2$, which is the start of the next vector in string D corresponding to the next length $\vec{u}_i$. Control passes back to Line 2. As can be seen, the only input length of consequence in string $D_n$ is the length that is identically equal to 9, i.e., which is the longest string of consecutive zeros followed by a 1 bit. Thus, the iterations will continue until vector length $u_i$=9 is encountered. This occurs in string D at bit location S=32 and at index i=13 in string $D_n$ where the first occurrence of a 9 appears.

In Line 6, Offset=$((-S-11) \mod 44)=((-32-11) \mod 44)=1$. Since Offset>0, in Line 10, a total of Offset symbols have been deleted in this code-constrained sequence. To correct for this loss of synchronization, Offset number of symbols are inserted at location (S−15)=(32−15)=17 of string D. Since Offset=1, only a single symbol gets inserted into the sequence at location 17. With this single symbol insertion at location 17, string D now becomes:

$$D = 0100100101010101000101000011000\ 10100000000101$$
$$00100010010101000000101000010\ 10100000000101$$
$$000010000010010100010100100100\ 10100000000101$$

Continuing at this point, location marker S is incremented to (S+9+Offset)=(32+9+1)=42 and i=14. Control then passes back to the top of the loop.

The next run of 8 consecutive zeros followed by a 1 bit is encountered at location S=77 and index i=27. Then, in Line 6, Offset=((−S−11) mod 44)=((−77−11) mod 44)=0. Because Offset evaluates to zero, in Line 7, the present method simply updates location marker S and index i, in Line 8, and returns control back to the loop.

The next run of 8 consecutive zeros followed by a 1 bit is encountered at location S=121 and index i=39. In Line 6, Offset=((−S−11) mod 44)=((−121−11) mod 44)=0. Again, because Offset evaluates to zero no further change to string D is made. As a result, the corrected output version of string D given above is the final output of the algorithm.

Finally, the redundant 14 bits at the end of each block of length 44 are subsequently eliminated from string D. Hence, the following (1,7) code-constrained string is obtained:

$$B_1 = 0100100101010101000101000011000$$
$$00100010010101000000101000010$$
$$000010000010010100010100100100$$

The (1,7) code-constraints to the above string are then removed to obtain the following unconstrained string:

$$A_1 = 00001100100010011001101011011110101110111011100001\text{-}00010101111$$

Next, string A1 is EXCLUSIVE OR'd with the original information string A so as to see the extent of the error propagation. Note that a 0 denotes no error for that particular bit in the original sequence. As a result, the following error string is obtained:

$$A_1 \oplus A = 00000000001100010110000000000000101\text{-}00000000000000000000100$$

Since the loss of synchronization has been restored, what remains in the original sequence are two burst errors of limited length plus some random errors all of which can be corrected by the ECC encoding of the sequence.

In summary, a method for recovering from synchronization errors in code-constrained sequences in the presence of random errors is disclosed. The method entails dividing the data into blocks, whereafter, synchronization vectors which are appended at the end of each block. To recover from the synchronization errors upon detection, a logical test is performed on each block. The number of deletions or insertions can be determined and synchronization restored. As a result of the present method, the work of the ECC can be minimized and a higher density of stored data can be achieved.

This invention may be embodied in other specific forms without departing from its spirit or essential characteristics. The above-described embodiments of the present invention are to be considered in all respects only as illustrative and not restrictive in scope. The scope of the invention is, therefore, indicated by the appended claims rather than by the above-detailed description. Therefore, all changes which come within the meaning and range of equivalency of the claims are to be considered embraced within their scope.

What is claimed and desired to be secured by United States Letters Patent is:

1. A method for recovery from synchronization errors caused by deletions and/or insertions of symbols in the presence of errors that alter the symbols in code-constrained data, and comprising the steps of:

a) dividing the code-constrained data into a plurality of data blocks;

b) selecting a synchronization vector which includes a symbol that is not encountered in the code-constrained data;

c) inserting said synchronization vector into datablocks of said plurality of datablocks;

d) detecting a loss of synchronization between datablocks of the plurality of datablocks, in response to the synchronization vector in the datablocks; and e) recovering from the loss of synchronization in response to the synchronization vector in said datablocks.

2. A method as defined in claim 1 wherein said datablocks are divided into equal size blocks.

3. A method as defined in claim 1 wherein the step of inserting the synchronization vector into each of the datablocks further comprises inserting the synchronization vector at the end of each of said datablocks.

4. A method as defined in claim 1 wherein the step of detecting a loss of synchronization in each of said datablocks further comprises determining the size of any insertions and deletions in said datablock.

5. A method as defined in claim 1 wherein the step of detecting a loss of synchronization further comprises scanning for the inserted synchronization vector starting at the presumed insertion location in each of said datablocks.

6. A method as defined in claim 1 wherein the step of recovering from a loss of synchronization further comprises determining an offset with respect to the location of the inserted synchronization vector.

7. A method as defined in claim 1 wherein the step of recovering from a loss of synchronization further comprises adding a number of symbols to each of said datablocks wherein a number of deletions of symbols has been detected.

8. A method as defined in claim 1 wherein the step of recovering from a loss of synchronization further comprises deleting a number of symbols from each of said datablocks wherein a number of additions of symbols has been detected.

9. A method as defined in claim 1 wherein the datablocks are encoded with an Error-Correction Code.

10. A method for recovery from synchronization errors caused by deletions and/or insertions of symbols in the presence of errors that alter the symbols in code-constrained data, comprising the steps of:

a) dividing the code-constrained data into a plurality of equal size blocks;

b) selecting a synchronization vector which includes a symbol that is not encountered in the code-constrained data;

c) inserting said synchronization vector into said code-constrained data, at the end of each of said equal sized blocks.

d) detecting a loss of synchronization between datablocks of the plurality of datablocks;

e) recovering from the loss of synchronization by determining an offset with respect to the locations of the inserted synchronization vector in the datablocks; and f) adding a number of symbols to the datablocks wherein a number of deletions of symbols has been detected and deleting a number of symbols from the datablocks wherein a number of additions of symbols has been detected.

11. A method as defined in claim 10 step (b) wherein the step of selecting a synchronization vector further comprises defining a the synchronization vector as a sequence of symbols that does not appear in the vicinity of the location of where said vector was inserted into said datablock.

12. A method as defined in claim 10 wherein the step of detecting a loss of synchronization in each of said datablocks further comprises determining the size of any insertions and deletions in said block.

13. A method as defined in claim 10 wherein the step of detecting a loss of synchronization further comprises scanning for the inserted synchronization vector starting at the presumed insertion location in each of said datablocks.

14. A method as defined in claim 10 wherein the datablocks are encoded with an Error-Correction Code.

15. A method for recovery from synchronization errors in code-constrained data, comprising the steps of:
   a) dividing data into equal sized blocks;
   b) selecting a synchronization vector for insertion into said datablocks;
   c) inserting said synchronization vector at the end of each of said datablocks;
   d) detecting a loss of synchronization in each of said datablocks comprising the steps of:
      1) determining the size of any insertions and deletions in said datablock; and
      2) scanning for the inserted synchronization vector at the presumed insertion location in each of said datablocks;
   e) recovering from a loss of synchronization in each of said datablocks comprising the steps of:
      1) determining an offset with respect to the location of the inserted synchronization vector;
      2) adding a number of symbols to each of said datablocks wherein a number of deletions of symbols has been detected; and
      3) deleting a number of symbols from each of said datablocks wherein a number of additions of symbols has been detected.

16. A method for recovery from synchronization errors caused by deletion and/or insertions of symbols in the presence of errors that alter the symbols in a modulated sequence of 0's and 1's in which each 1 is separated by at least d 0's and by at most k number of 0's, called a (d,k) constrained sequence, comprising the steps of:
   a) for each block of data of size m-k-2d-5 inserting the synchronization symbol of length k+2d+5, $\vec{r} = x00\ldots 0100 \ldots 0100 \ldots 0y,$ at the end of the block, where x is the complement of the previous bit and y is the complement of the next bit, wherein the number of consecutive 0's between marker x and the first 1 is d, and wherein the number of consecutive 0's between the first 1 and the second 1 is k+1, and wherein the number of consecutive 0's between the second 1 and y is d,
   b) resynchronizing a modulated sequence subject to a possible number of insertions and/or deletions of symbols comprising the steps of:
      1) scanning for a run of k+1 consecutive 0's starting at location (m-k-d-2) of the current block;
      2) establishing the offset of the run of k+1 0's with respect to location m-k-d-2; and
      3) re-establishing synchronization by adding or subtracting a number of symbols in the middle of the block according to the offset described above.

17. A computer program product for use in an error detection and correction computer system for recovery from synchronization errors in code-constrained data, comprising:
   magnetic recording medium means for recording computer instructions; and
   instruction means recorded on said magnetic recording medium means for controlling said computer system, said instruction means comprising:
      a) means to divide data to be error corrected into equal sized blocks;
      b) means to select a synchronization vector for insertion into said datablocks;
      c) means to insert said synchronization vector at the end of each of said datablocks;
      d) means to detect a loss of synchronization in each of said datablocks comprising:
         1) means for determining the size of any insertions and deletions in said datablock; and
         2) means for scanning for the inserted synchronization vector at the presumed insertion location in each of said datablocks;
      e) means for recovering from a loss of synchronization in each of said datablocks comprising:
         1) means for determining an offset with respect to the location of the inserted synchronization vector;
         2) means for adding a number of symbols to each of said datablocks wherein a number of deletions of symbols has been detected; and
         3) means for deleting a number of symbols from each of said datablocks wherein a number of additions 18. A computer program product for use in an error detection and correction computer system for recovery from synchronization errors in (d,k) constrained data wherein the modulated sequence of 0's and 1's in which each 1 is separated by at least d 0's and by at most k number of 0's has been disrupted by insertions and/or deletions of symbols, comprising:
   magnetic recording medium means for recording computer instructions; and
   instruction means recorded on said magnetic recording medium means for causing said computer system to execute the instruction steps of:
      a) for each block of data of size m-k-2d-5 inserting the synchronization symbol of length k+2d+5, $\vec{r} = x00\ldots 0100 \ldots 0100 \ldots 0y,$ at the end of the block, where x is the complement of the previous bit and y is the complement of the next bit, wherein the number of consecutive 0's between marker x and the first 1 is d, and wherein the number of consecutive 0's between the first 1 and the second 1 is k+1, and wherein the number of consecutive 0's between the second 1 and y is d,
      b) resynchronizing a modulated sequence subject to a possible number of insertions and/or deletions of symbols comprising the steps of:
         1) scanning or a run of k+1 consecutive 0's starting at location (m-k-d-2) of the current block;
         2) establishing the offset of the run of k+1 0's with respect to location m-k-d-2; and
         3) re-establishing synchronization by adding or subtracting a number of symbols in the middle of the block according to the offset described above.

* * * * *

UNITED STATES PATENT AND TRADEMARK OFFICE
CERTIFICATE OF CORRECTION

PATENT NO. : 5,461,631
DATED : Oct. 24, 1995
INVENTOR(S) : Miguel M. Blaum, Jehoshua Bruck and Constantin M. Melas It is certified that error appears in the above-indentified patent and that said Letters Patent is hereby corrected as shown below:

Column 12, line 31: after "additions"
insert --of symbols has been detected.--

Signed and Sealed this

Eleventh Day of June, 1996

Attest:

BRUCE LEHMAN

Attesting Officer    Commissioner of Patents and Trademarks